United States Patent [19]
Ishibashi et al.

[11] Patent Number: 5,412,223
[45] Date of Patent: May 2, 1995

[54] SEMICONDUCTOR DEVICE EXPLOITING A QUANTUM INTERFERENCE EFFECT

[75] Inventors: Akira Ishibashi; Masamichi Ogawa, both of Kanagawa, Japan

[73] Assignee: Sony Corporation, Tokyo, Japan

[21] Appl. No.: 149,954

[22] Filed: Nov. 10, 1993

[30] Foreign Application Priority Data

Nov. 11, 1992 [JP] Japan .................. 4-326025

[51] Int. Cl.$^6$ ........................... H01L 29/161
[52] U.S. Cl. ........................ 257/14; 257/20; 257/24; 257/192
[58] Field of Search .............. 257/12, 14, 17, 20, 257/24, 192, 425, 25

[56] References Cited

U.S. PATENT DOCUMENTS

| | | | |
|---|---|---|---|
| 5,003,360 | 3/1991 | Okada et al. | 257/192 |
| 5,130,766 | 7/1992 | Arimoto et al. | 257/192 |
| 5,153,688 | 10/1992 | Oda et al. | 257/192 |
| 5,157,467 | 10/1992 | Fujii | 257/192 |
| 5,233,205 | 8/1993 | Usagawa et al. | 257/23 |

FOREIGN PATENT DOCUMENTS

| | | | |
|---|---|---|---|
| 0475403 | 3/1992 | European Pat. Off. | 257/21 |
| 1-129468 | 5/1989 | Japan | 257/24 |
| 2-210880 | 8/1990 | Japan | 257/24 |
| 2-305477 | 12/1990 | Japan | 257/24 |
| 2-305478 | 12/1990 | Japan | 257/425 |
| 3-253875 | 11/1991 | Japan | 257/14 |

Primary Examiner—Robert P. Limanek
Assistant Examiner—Minhloan Tran
Attorney, Agent, or Firm—Hill, Steadman & Simpson

[57] ABSTRACT

A semiconductor device exploiting a quantum interference effect is disclosed. The device comprises: a rod-shaped semiconductor portion extending in one direction; a prism-shaped semiconductor portion covering side faces of the rod-shaped semiconductor portion and extending in the one direction; and one or more source electrodes and one or more drain electrodes electrically connected to opposite ends of the prism-shaped semiconductor portion. Channels extend in the one direction in the prism-shaped semiconductor portion along a plurality of sides of side faces thereof. Alternatively, the prism-shaped semiconductor portion has a twisted structure about an axis extending in the one direction, and channels each having a twisted structure extend in the one direction in the prism-shaped semiconductor portion along a plurality of sides of side faces thereof.

14 Claims, 6 Drawing Sheets

SEMICONDUCTOR DEVICE EXPLOITING A QUANTUM INTERFERENCE EFFECT

BACKGROUND OF THE INVENTION

1. Field of the Invention

This invention relates to a semiconductor device exploiting a quantum interference effect.

2. Description of the Prior Art

Existing semiconductor devices, such as MISFET, JFET, MESFET, and so on, use a channel having the same structure as a "flat plate" from a topological viewpoint, and any of such existing devices includes only one channel. FIG. 1 shows an example of such existing MESFETs. As shown in FIG. 1, the existing MESFET includes a channel 102 in the form of a flat plate provided on an insulating substrate 101, a source 103 and a drain 104 provided at opposite ends of the channel 102, and a gate electrode 105 provided on the channel 102.

In existing semiconductor devices having a single plate-shaped channel as referred to above, on/off actions are performed by controlling conduction and nonconduction of the channel. Therefore, they are available only for simple operations.

OBJECTS AND SUMMARY OF THE INVENTION

It is therefore an object of the invention to provide a semiconductor device exploiting a quantum interference effect, which can realize a more complicated and advanced operation than those of existing semiconductor devices.

Another object of the invention is to provide a semiconductor device exploiting a quantum interference effect, which can realize a more complicated and advanced operation than those of existing semiconductor devices, by utilizing an interference among carriers, that is, electrons or holes, which run through a plurality of channels extending along edges or sides of side faces of a prism to control symmetry of wave functions of electrons or holes, or other factors.

Still another object of the invention is to provide a semiconductor device exploiting a quantum interference effect, which leads to realization of an operation, such as detection of Berry's phase, which is difficult to realize with existing semiconductor devices, by using a plurality of channels extending along sides of side faces of a prism twisted by a predetermined angle about its center axis.

Yet another object of the invention is to provide a semiconductor device exploiting a quantum interference effect, which has channels of a multiply connected structure and can therefore give an advanced interference effect which is not obtained with a device using a channel having a simply connected structure.

According to an aspect of the invention, there is provided a semiconductor device exploiting a quantum interference effect, comprising:

a rod-shaped semiconductor portion extending in one direction;

a prism-shaped semiconductor portion covering side faces of the rod-shaped semiconductor portion and extending in the one direction; and one or more source electrodes and one or more drain electrodes electrically connected to opposite ends of the prism-shaped semiconductor portion, channels extending in the one direction in the prism-shaped semiconductor portion along a plurality of sides of side faces thereof.

According to another aspect of the invention, there is provided a semiconductor device exploiting a quantum interference effect, comprising:

a rod-shaped semiconductor portion extending in one direction;

a prism-shaped semiconductor portion covering side faces of the rod-shaped semiconductor portion and extending in the one direction; and one or more source electrodes and one or more drain electrodes electrically connected to opposite ends of the prism-shaped semiconductor portion, the prism-shaped semiconductor portion having a twisted structure about an axis extending in the one direction, and channels each having a twisted structure extending in the one direction in the prism-shaped semiconductor portion along a plurality of sides of side faces thereof.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
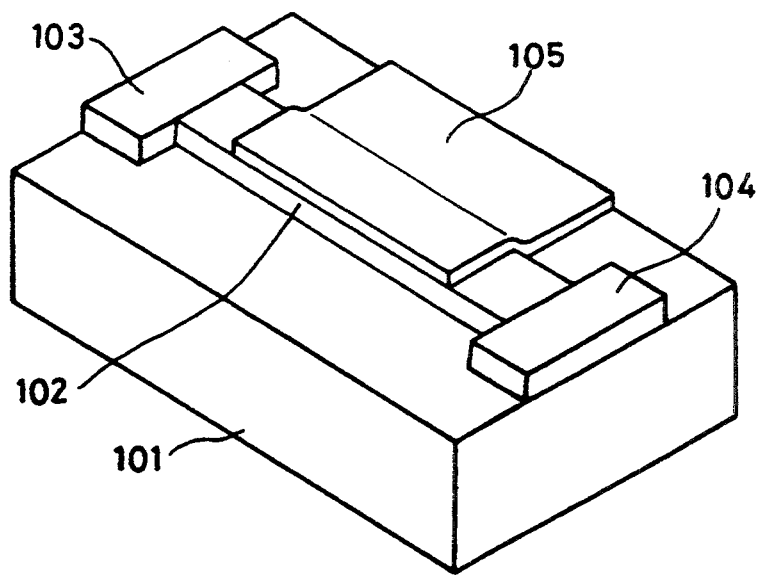
FIG. 1 is a perspective view of an existing MESFET.

Embodiments of the invention will be explained below with reference to the drawings. In all of the drawings of the embodiments, the same or equivalent elements are labeled with the same reference numerals.

Figure 2:
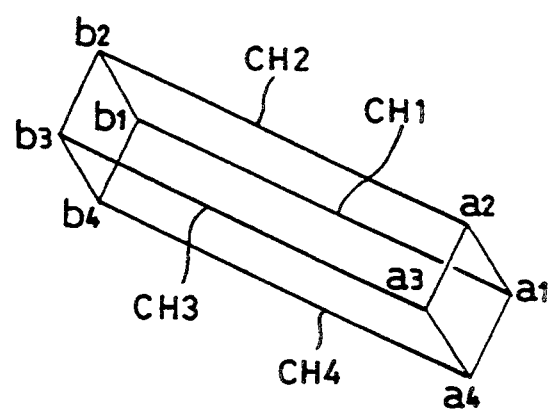
FIG. 2 is a schematic diagram conceptually showing a channel portion in a quantum interference semiconductor device according to a first embodiment of the invention.

FIG. 2 shows a quantum interference semiconductor device according to a first embodiment of the invention and, in particular, conceptually shows its channel portion.

In the first embodiment, as shown in FIG. 2, four channels CH1, CH2, CH3 and CH4 are provided along four edges or sides of side faces of a quadrangular prism (for example, a square prism). In this structure, these channels CH1, CH2, CH3 and CH4 extend in parallel. In FIG. 2, $a_1$, $a_2$, $a_3$ and $a_4$ are four vertices of one of bases of the quadrangular prism, and $b_1$, $b_2$, $b_3$ and $b_4$ are four vertices of the other base of the quadrangular prism. Opposite ends of the channel CH1 are $a_1$ and $b_1$, those of the channel CH2 are $a_2$ and $b_2$, those of the channel CH3 are $a_3$ and $b_3$, and those of the channel CH4 are $a_4$ and $b_4$. In other words, there is a relation of $a_i \rightarrow b_i$ ($i=1, 2, 3, 4$).

By comparing the first embodiment with the existing MESFET shown in FIG. 1, the channels CH1, CH2, CH3 and CH4 in the first embodiment may be regarded as edge-enhanced ones of the bulk channel 102 shown in FIG. 1.

Figure 3:
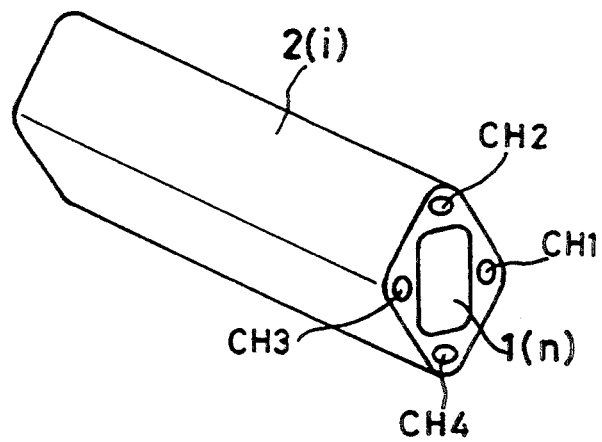
FIG. 3 is a perspective view of a specific structure of the channel portion in the quantum interference semiconductor device according to the first embodiment of the invention.

FIG. 3 shows a specific structure of the channel portion shown in FIG. 2.

In the structure shown in FIG. 3, an intrinsic (i-type) GaAs 2 having a quadrangular prism-shaped outer configuration concentrically covers a quadrangular prism-shaped n-type AlGaAs 1 in a relatively rotated relationship by 45 degrees. In this structure, the n-type AlGaAs 1 and the i-type GaAs 2 make a heterostructure, and channels CH1, CH2, CH3 and CH4 made of electrons supplied from the n-type AlGaAs 1 of the heterostructure extend along four edges or sides of side faces of the i-type GaAs 2.

The channel portion shown in FIG. 3 may be fabricated by first making the quadrangular prism-shaped n-type AlGaAs 1 by, for example, etching, and by subsequently epitaxially growing the i-type GaAs 2 around the n-type AlGaAs 1 by, for example, metallo-organic chemical vapor deposition (MOCVD) method.

Figure 4:
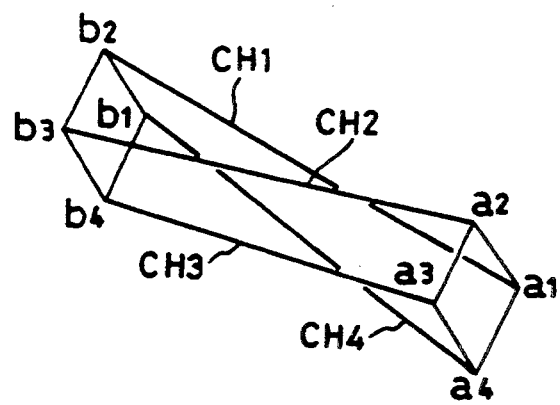
FIG. 4 is a schematic diagram conceptually showing a channel portion in a quantum interference semiconductor device according to a second embodiment of the invention.

FIG. 4 shows a quantum interference semiconductor device according to a second embodiment of the invention and, in particular, conceptually shows its channel portion.

In the second embodiment shown in FIG. 4, four channels CH1, CH2, CH3 and CH4 are provided along four edges or sides of side faces of a quadrangular prism (for example, a square prism) twisted by 90 degrees about its center axis. In this structure, opposite ends of the channel CH1 are $a_1$ and $b_2$, those of the channel CH2 are $a_2$ and $b_3$, those of the channel CH3 are $a_3$ and $b_4$, and those of the channel CH4 are $a_4$ and $b_1$. That is, there is a relation of $a_i \rightarrow b_{i+1}$ ($i=1, 2, 3, 4$) where $b_5 = b_1$.

The inventors of the present invention has confirmed through experiments that the channel portion shown in FIG. 4, like the channel portion of FIG. 3, can be realized by using epitaxial growth by MOCVD method.

Figure 5:
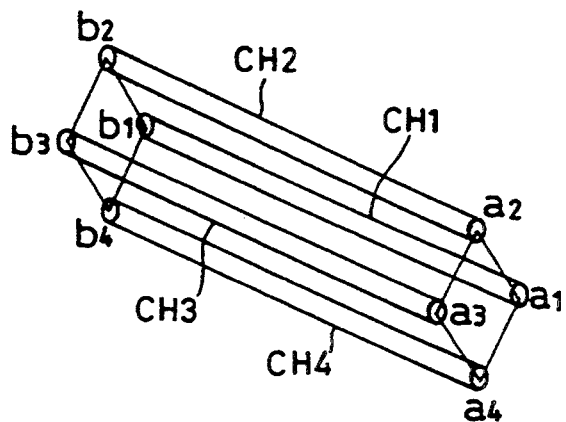
FIG. 5 is a schematic diagram conceptually showing a channel portion in a quantum interference semiconductor device according to a third embodiment of the invention.

FIG. 5 shows a quantum interference semiconductor device according to a third embodiment of the invention and, in particular, conceptually shows its channel portion.

In the third embodiment shown in FIG. 5, four channels CH1, CH2, CH3 and CH4 each having a doubly connected structure defined by a cylindrical surface extend along four edges or sides of side faces of a quadrangular prism (for example, a square prism). In other words, the third embodiment may be regarded as doubly connected ones of the channels CH1, CH2, CH3 and CH4 in the first embodiment.

Figure 6:
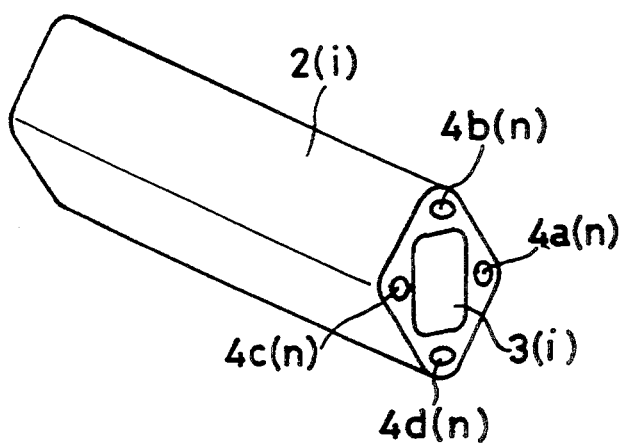
FIG. 6 is a perspective view of a specific structure of the channel portion in the quantum interference semiconductor device according to the third embodiment.

FIG. 6 shows a specific structure of the channel portion of FIG. 5.

In the structure shown in FIG. 6, an i-type GaAs 2 having a quadrangular prism-shaped outer configuration concentrically covers a quadrangular prism-shaped i-type AlGaAs 3 in a relatively rotated relationship by 45 degrees, and n-type AlGaAs $4a$, $4b$, $4c$ and $4d$ are buried in the i-type GaAs 2 along its four sides of side faces in parallel with the center axis. In this case, electrons are supplied from the n-type AlGaAs $4a$, $4b$, $4c$ and $4d$ into the i-type GaAs 2 near the interface of the heterostructure made by the n-type AlGaAs $4a$, $4b$, $4c$ and $4d$ and the i-type GaAs 2. Part of the i-type GaAs 2 supplied with electrons around the n-type AlGaAs $4a$ forms the channel CH1 having a doubly connected structure, part of the i-type GaAs 2 supplied with electrons around the n-type AlGaAs $4b$ forms the channel CH2 having a doubly connected structure, part of the i-type GaAs 2 supplied with electrons around the n-type AlGaAs $4c$ forms the channel CH3, and part of the i-type GaAs 2 supplied with electrons around the n-type AlGaAs $4d$ forms the channel CH4.

The channel portion shown in FIG. 6 may be fabricated by first preparing the quadrangular prism-shaped i-type AlGaAs 3, by next epitaxially growing a thin i-type GaAs 2 around the i-type AlGaAs 3, by further epitaxially growing the n-type AlGaAs $4a$, $4b$, $4c$ and $4d$ on the i-type GaAs 2, and by again epitaxially growing the i-type GaAs 2 around the n-type AlGaAs $4a$, $4b$, $4c$ and $4d$ and the i-type GaAs 2.

Figure 7:
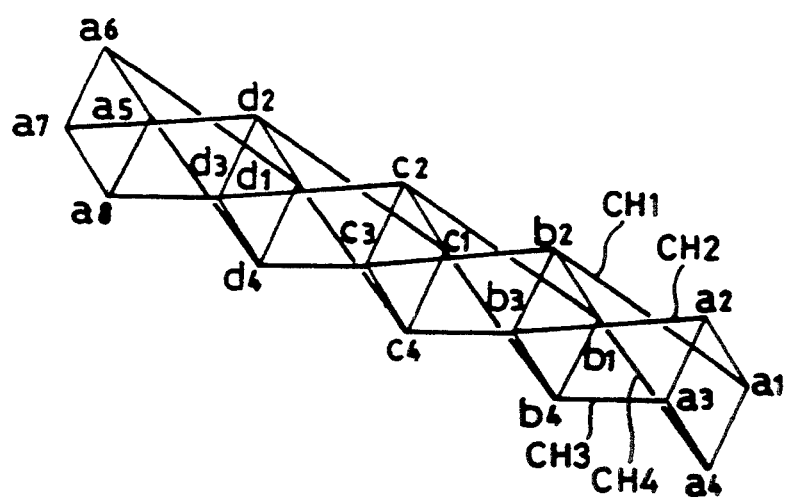
FIG. 7 is a schematic diagram conceptually showing a channel portion in a quantum interference semiconductor device according to a fourth embodiment of the invention.

FIG. 7 shows a quantum interference semiconductor device according to a fourth embodiment of the invention and, in particular, conceptually shows its channel portion.

In the fourth embodiment shown in FIG. 7, the channel portion is made by serially connecting four structures, each being the same as that of FIG. 4, which is twisted by 90 degrees. In this case, the channel CH1 follows the course of $a_1 \rightarrow b_2 \rightarrow c_3 \rightarrow d_4 \rightarrow a_5$, the channel CH2 follows the course of $a_2 \rightarrow b_3 \rightarrow c_4 \rightarrow d_1 \rightarrow a_6$, the channel CH3 follows the course of $a_3 \rightarrow b_4 \rightarrow c_1 \rightarrow d_2 \rightarrow a_7$, and the channel CH4 follows the course of $a_4 \rightarrow b_1 \rightarrow c_2 \rightarrow d_3 \rightarrow a_8$. That is, in a general expression, a channel CHi follows a course of $a_i \rightarrow b_{i+1} \rightarrow c_{i+2} \rightarrow d_{i+3} \rightarrow a_{i+4}$ where $b_5 = b_1$, $c_5 = c_1$, $c_6 = c_2$, $d_5 = d_1$, $d_6 = d_2$, and $d_7 = d_3$. In this case, each channel CHi is rotated (twisted) by 90 degrees at respective portions of $a_i \rightarrow b_{i+1}$, $b_{i+1} \rightarrow c_{i+2}$, $c_{i+2} \rightarrow d_{i+3}$ and $d_{i+3} \rightarrow a_{i+4}$, and is therefore rotated by 360 degrees in total from one end $a_i$ to the other end $a_{i+4}$ of the channel portion. Therefore, at the other end of the channel portion, each channel CHi returns to the same condition as that of the one end of the channel portion. That is, $a_{i+4}$ and $a_i$ are equivalent such that $a_5 = a_1$, $a_6 = a_2$, $a_7 = a_3$ and $a_8 = a_4$.

When the channel portion according to the fourth embodiment having the above-explained construction is put in, for example, an external magnetic field, electrons running through the channels CH1, CH2, CH3 and CH4 obtain Berry's phases (see, for example, "Parity" Vol. 03 No. 09 1988-09 pp. 26-36).

Figure 8:
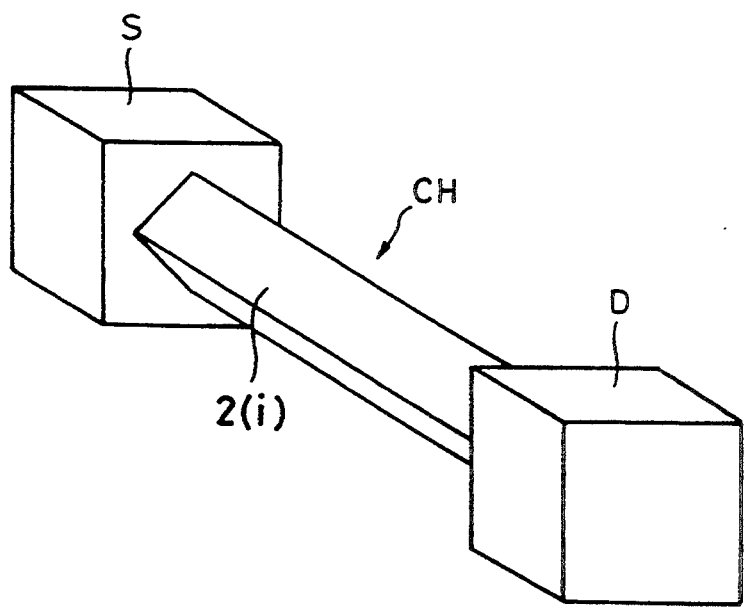
FIG. 8 is a perspective view of a two-terminal quantum interference semiconductor device using a channel portion of the same structure as shown in FIG. 2.

FIG. 8 shows a specific structure of a two-terminal quantum interference semiconductor device which uses a channel portion having the same structure as that shown in FIG. 3.

In the two-terminal quantum interference semiconductor device shown in FIG. 8, a source S and a drain D are provided at opposite ends of a channel portion CH having the same structure as shown in FIG. 3. These source S and drain D may be made of, for example, n-type GaAs.

The two-terminal quantum interference semiconductor device shown in FIG. 8 can be used as, for example, a magnetic field detector.

Figure 9:
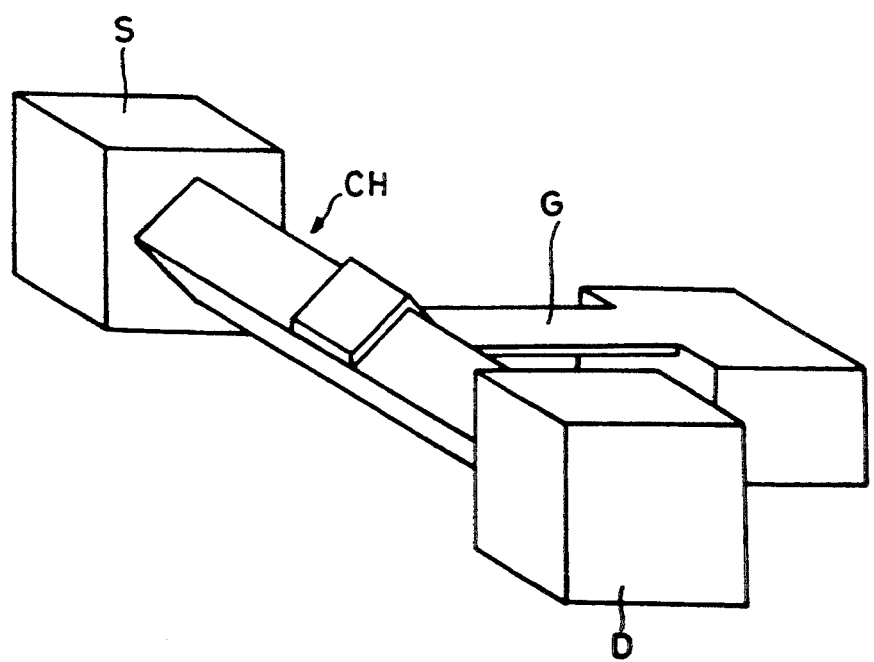
FIG. 9 is a perspective view of a three-terminal quantum interference semiconductor device using a channel portion of the same structure as shown in FIG. 2.

FIG. 9 shows a specific structure of a three-terminal quantum interference semiconductor device which uses a channel portion having the same structure as shown in FIG. 3.

In the three-terminal quantum interference semiconductor device shown in FIG. 9, a source S and a drain D are provided at opposite ends of a channel portion CH having the same construction as shown in FIG. 3, and a gate electrode G is provided on the channel portion CH.

The quantum interference semiconductor device shown in FIG. 9 may be employed as, for example, a phase interference device.

Figure 10:
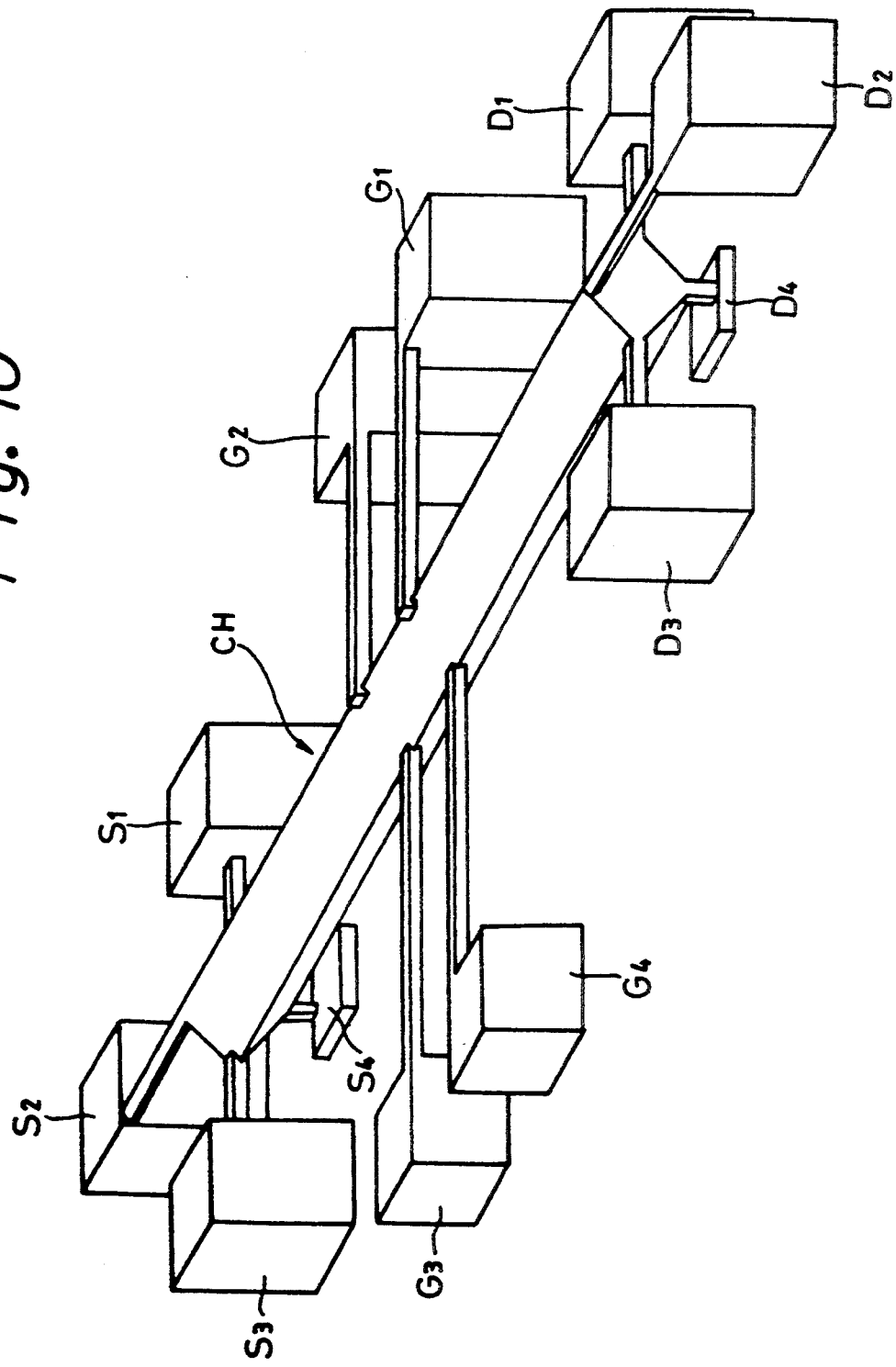
FIG. 10 is perspective view of a twelve-terminal quantum interference semiconductor device using a channel portion of the same structure as shown in FIG. 2.

FIG. 10 shows a specific construction of a twelve-terminal quantum interference semiconductor device which uses a channel portion having the same structure as shown in FIG. 3.

In the twelve-terminal quantum interference semiconductor device shown in FIG. 10, four sources $S_1$, $S_2$, $S_3$ and $S_4$ are provided at one end of a channel portion CH having the same structure shown in FIG. 3, and four drains $D_1$, $D_2$, $D_3$ and $D_4$ are provided at the other end. In this case, the source $S_1$ and the drain $D_1$ are connected to opposite ends of a channel CH1, the source $S_2$ and the drain $D_2$ are connected to opposite ends of a channel CH2, the source $S_3$ and the drain $D_3$ are connected to opposite ends of a channel CH3, and the source $S_4$ and the drain $D_4$ are connected to opposite ends of a channel CH4. Further provided to the channel portion CH are four gate electrodes $G_1$, $G_2$, $G_3$ and $G_4$. In this case, the gate electrodes $G_1$ and $G_2$ are used to control the channel CH2 while the gate electrodes $G_3$ and $G_4$ are used to control the channel CH3.

Explained above is a construction of the quantum interference semiconductor device which uses the channel portion having the same structure as shown in FIG. 3. The channel portion, however, may be replaced by another as shown in FIG. 4 or FIG. 7. In particular, in a quantum interference semiconductor device using a channel portion as shown in FIG. 7, sources and drains can be connected to channels CH1, CH2, CH3 and CH4 in mutually corresponding positions. Therefore, by using this quantum interference semiconductor device in various external parameters (such as external field), detection of Berry's phases is possible.

Figure 11:
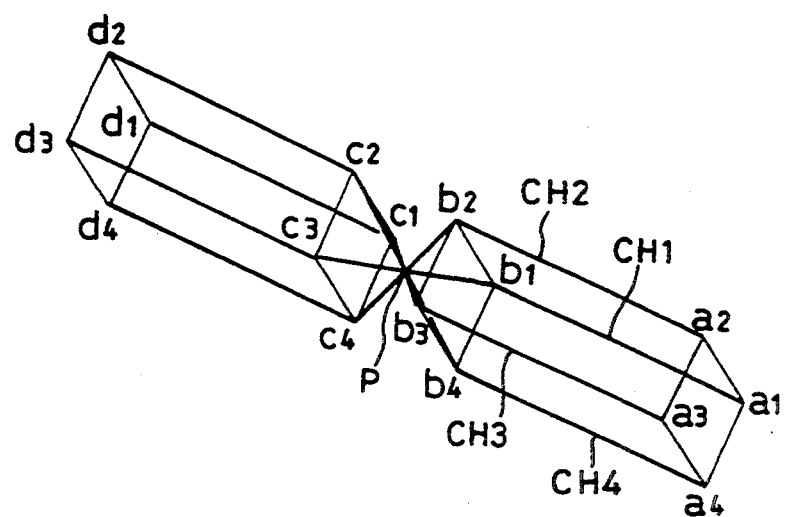
FIG. 11 is a schematic diagram conceptually showing a channel portion in a quantum interference semiconductor device according to a fifth embodiment of the invention.

FIG. 11 shows a quantum interference semiconductor device according to a fifth embodiment of the invention and, in particular, conceptually shows its channel portion.

In the fifth embodiment shown in FIG. 11, two quadrangular prisms (for example, square prisms), each having one end in the form of a pyramid, are coupled such that apexes of the pyramids join together, and four channels CH1, CH2, CH3 and CH4 are provided along edges or sides of side faces thereof.

In the fifth embodiment, since the channels CH1, CH2, CH3 and CH4 once converge on a point P, the point of conversion may be regarded as a point source of electrons, and the interference contrast can therefore be increased.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first to fifth embodiments have been explained as using four channels CH1, CH2, CH3 and CH4 formed on the basis of a quadrangular prism, a quantum interference semiconductor device using a plurality of channels formed on the basis of a hexagonal, octagonal or other prism other than the quadrangular prism can be realized. In this case, configuration of such a prism can be controlled by controlling conditions for epitaxial growth for fabricating the prism (for example, a ratio of a material for a group III element to that for a group V element, growth temperature, and so on in case of making the prism of III-V compound semiconductors).

The channel portion shown in FIG. 3 and that shown in FIG. 6 are made of AlGaAs/GaAs heterostructure. However, various semiconductor heterostructures other than the AlGaAs/GaAs heterostructure may be used to make such a channel portion.

The third embodiment has been explained as using the channels CH1, CH2, CH3 and CH4 in a doubly connected structure. However, the channels CH1, CH2, CH3 and CH4 may be a multiply connected structure having a connectivity equal to or larger than 3.

Figure 12:
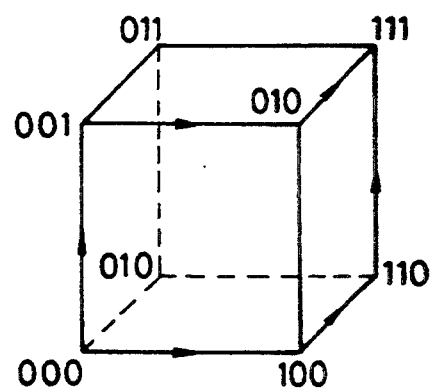
FIG. 12 is a schematic diagram for explaining possibility of application of the present invention to a connection machine.

According to the present invention, channel switching in a so-called connection machine, which has become of major interest lately, can be done in a microscopic scale. That is, as shown in FIG. 12, in case of transferring a signal, for example, from (000) to (111), although a transfer path is switched to another in dependence of a current condition of use of the channel, these transfer paths may be regarded as an equivalence of an edge-enhanced bulk channel. Therefore, quantum interference semiconductor devices according to the invention make it possible to switch channels in a connection machine in a microscopic scale.

What is claimed is:

1. A semiconductor device exploiting a quantum interference effect, comprising:
    a rod-shaped semiconductor portion extending in one direction;
    a prism-shaped semiconductor portion covering said rod-shaped semiconductor portion, said prism-shaped semiconductor portion having side faces and extending in said one direction;
    at least one source electrode and at least one drain electrode electrically connected to opposite ends of said prism-shaped semiconductor portion; and
    separate channels extending in said one direction in said prism-shaped semiconductor portion with a single channel along each of a plurality of edges of the side faces thereof.

2. The semiconductor device according to claim 1 wherein at least one gate electrode is provided on each side face of said prism-shaped semiconductor portion.

3. The semiconductor device according to claim 1 wherein said prism-shaped semiconductor portion is placed in a magnetic field.

4. The semiconductor device according to claim 1 wherein each of said channels has a multiply connected structure.

5. The semiconductor device according to claim 4 wherein semiconductor portions for supplying carriers are buried in said prism-shaped semiconductor portion so as to extend in said one direction along a plurality of edges of said side faces thereof and wherein each said channel has a doubly connected structure.

6. The semiconductor device according to claim 1 wherein said source electrode and said drain electrode are provided independently for each of said channels.

7. A semiconductor device exploiting a quantum interference effect, comprising:
a rod-shaped semiconductor portion extending in one direction;
a prism-shaped semiconductor portion covering side faces of said rod-shaped semiconductor portion and extending in said one direction;
at least one source electrode and at least one drain electrode electrically connected to opposite ends of said prism-shaped semiconductor portion,
said prism-shaped semiconductor portion having a twisted structure about an axis extending in said one direction, and
channels each having a twisted structure extending in said one direction in said prism-shaped semiconductor portion along a plurality of sides of side faces thereof.

8. The semiconductor device according to claim 7 wherein at least one gate electrode is provided on each side face of said prism-shaped semiconductor portion.

9. The semiconductor device according to claim 7 wherein said prism-shaped semiconductor portion includes a plurality of twisted structures.

10. The semiconductor device according to claim 9 wherein a plurality of gate electrodes are provided on side faces of said prism-shaped semiconductor portion.

11. The semiconductor device according to claim 7 wherein said prism-shaped semiconductor portion is placed in a magnetic field.

12. The semiconductor device according to claim 7 wherein each of said channels has a multiply connected structure.

13. The semiconductor device according to claim 12 wherein semiconductor portions for supplying carriers are buried in said prism-shaped semiconductor portion so as to extend in said one direction along a plurality of sides of side faces thereof, and each of said channels has a doubly connected structure.

14. The semiconductor device according to claim 7 wherein said source electrode and said drain electrode are provided independently for each of said channels.

* * * * *